(12) United States Patent
Sasaki et al.

(10) Patent No.: US 10,923,649 B2
(45) Date of Patent: Feb. 16, 2021

(54) SPIN CURRENT MAGNETIZATION ROTATION MAGNETORESISTANCE EFFECT ELEMENT, AND MAGNETIC MEMORY

(71) Applicant: TDK CORPORATION, Tokyo (JP)

(72) Inventors: Tomoyuki Sasaki, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/413,066

(22) Filed: May 15, 2019

(65) Prior Publication Data

US 2019/0363244 A1 Nov. 28, 2019

(30) Foreign Application Priority Data

May 22, 2018 (JP) ................................ 2018-097558
May 8, 2019 (JP) ................................ 2019-088447

(51) Int. Cl.
*H01L 43/04* (2006.01)
*H01L 43/06* (2006.01)
(Continued)

(52) U.S. Cl.
CPC ............ *H01L 43/04* (2013.01); *G11C 11/161* (2013.01); *G11C 11/18* (2013.01); *H01F 10/329* (2013.01);
(Continued)

(58) Field of Classification Search
CPC ............... H01F 10/329; H01F 10/3254; H01L 43/04–06
See application file for complete search history.

(56) References Cited

U.S. PATENT DOCUMENTS 8,963,222 B2  2/2015  Guo
2008/0158740 A1*  7/2008  Nakayama .............. H01L 43/08
                                                    360/324.2
(Continued)

FOREIGN PATENT DOCUMENTS

JP  2018-067701 A  4/2018
WO  2018/155562 A1  8/2018

OTHER PUBLICATIONS

Takahashi, S. et al., "Spin Injection and Detection in Magnetic Nanostructures", Physical Review B67, pp. 052409-1-052409-4, 2003.

(Continued)

*Primary Examiner* — Alia Sabur
(74) *Attorney, Agent, or Firm* — Oliff PLC

(57) ABSTRACT

There is provided a spin current magnetization rotation magnetoresistance effect element that can reduce generation of a magnetic field influencing other elements.
The spin current magnetization rotation magnetoresistance effect element in which a spin-orbit torque wiring layer, a first ferromagnetic layer, an antiferromagnetic coupling layer, a second ferromagnetic layer, a nonmagnetic layer, and a magnetization reference layer are disposed in an order, wherein a magnitude of the product of the saturation magnetization of the first ferromagnetic layer and the film thickness of the first ferromagnetic layer is larger than a magnitude of the product of the saturation magnetization of the second ferromagnetic layer and the film thickness of the second ferromagnetic layer.

13 Claims, 7 Drawing Sheets

(51) Int. Cl.
*H01L 27/22* (2006.01)
*H01F 10/32* (2006.01)
*H01L 43/10* (2006.01)
*G11C 11/18* (2006.01)
*G11C 11/16* (2006.01)

(52) U.S. Cl.
CPC ..... *H01F 10/3254* (2013.01); *H01F 10/3268* (2013.01); *H01L 27/228* (2013.01); *H01L 43/06* (2013.01); *H01L 43/10* (2013.01)

(56) References Cited

U.S. PATENT DOCUMENTS

| | | | |
|---|---|---|---|
| 2010/0091555 A1* | 4/2010 | Fukami | B82Y 10/00 |
| | | | 365/158 |
| 2013/0009260 A1* | 1/2013 | Apalkov | G11C 11/161 |
| | | | 257/421 |
| 2013/0221461 A1* | 8/2013 | Sukegawa | H01L 43/08 |
| | | | 257/421 |
| 2014/0056061 A1* | 2/2014 | Khvalkovskiy | G11C 11/161 |
| | | | 365/158 |
| 2018/0114898 A1 | 4/2018 | Lee | |

OTHER PUBLICATIONS

Fukami, S. et al., "A Spin-Orbit Torque Switching Scheme With Collinear Magnetic Easy Axis and Current Configuration", Nature Nanotechnology, pp. 1-6, 2016.

* cited by examiner

SPIN CURRENT MAGNETIZATION ROTATION MAGNETORESISTANCE EFFECT ELEMENT, AND MAGNETIC MEMORY

BACKGROUND OF THE INVENTION

Field of the Invention

The present invention relates to a spin current magnetization rotation magnetoresistance effect element and a magnetic memory.

Priority is claimed on Japanese Patent Application No. 2018-097558, filed on May 22, 2018 and Japanese Patent Application No. 2019-088447, filed on May 8, 2019, the contents of which are incorporated herein by reference.

Description of Related Art

Regarding elements using change in resistance value (change in magnetoresistance) based on change in relative angle between magnetizations of two ferromagnetic layers, a giant magnetoresistance (GMR) element made of a multilayer film including a ferromagnetic layer and a nonmagnetic layer and a tunnel magnetoresistance (TMR) element using an insulating layer (a tunnel barrier layer and a barrier layer) as a nonmagnetic layer, and the like are known.

In recent years, among spin elements using change in magnetoresistance (elements using spintronics), a spin current magnetization rotation magnetoresistance effect element using a spin-orbit torque (SOT) and a magnetic wall movement type magnetic recording element using magnetic wall movement have been focused upon.

For example, Non Patent Document 1 describes a spin current magnetization rotation magnetoresistance effect element. An SOT is induced by a pure spin current that is generated by a spin-orbit interaction or the Rashba effect at an interface between different materials. A current for inducing an SOT in a spin current magnetization rotation magnetoresistance effect element flows in a direction crossing the lamination direction of the spin current magnetization rotation magnetoresistance effect element. There is no need for a current to flow in the lamination direction of the spin current magnetization rotation magnetoresistance effect element and a longer lifespan for the spin current magnetization rotation magnetoresistance effect element can be expected.

PATENT DOCUMENTS

[Patent Document 1] U.S. Pat. No. 8,963,222
[Patent Document 2] Japanese Unexamined Patent Application, First Publication No. 2018-67701

Non Patent Documents

[Non Patent Document 1] S. Fukami, T. Anekawa, C. Zhang and H. Ohno, Nature Nano Tec (2016). DOI: 10.1038/NNANO. 2016. 29.
[Non Patent Document 2] S. Takahashi and S. Maekawa, Phys. Rev. B67(5), 052409 (2003).

SUMMARY OF THE INVENTION

In a tunnel type magnetoresistance effect element (SOT-MTJ) using an SOT, a current flows through a spin-orbit torque wiring layer, and a spin current in a direction orthogonal to that of the current is generated so that the magnetization of a first ferromagnetic layer in contact with the spin-orbit torque wiring layer is inversed. In Non Patent Document 1, a spin-orbit torque wiring layer extends, a direction in which a current flows is set as the X direction, a direction orthogonal to the X direction in the plane of the laminated film is set as the Y direction, and a direction perpendicular to the laminated film surface is set as the Z direction. When a current flows through the spin-orbit torque wiring layer in the X direction, a spin current is generated. Spins reaching the interface between the spin-orbit torque wiring layer and the first ferromagnetic layer due to the spin current are directed in the Y direction. When the magnetization direction of the first ferromagnetic layer is the Y direction, since the direction of spins injected into the first ferromagnetic layer is the Y direction, the magnetization of the first ferromagnetic layer rotates even in an environment in which there is no magnetic field. When the magnetization direction of the first ferromagnetic layer is the X direction or the Z direction, a magnetic field having a component orthogonal to each of the magnetization direction and the direction of spins forming the spin current is applied to the first ferromagnetic layer, and thus the magnetization of the first ferromagnetic layer rotates. It is known that a magnetic field influences the magnetization rotation regardless of the magnetization direction of the first ferromagnetic layer. In particular, when the magnetization direction of the first ferromagnetic layer is the X direction or the Z direction, magnetization rotation of the first ferromagnetic layer is assisted even by a slight magnetic field. That is, the magnetic field influences magnetization rotation of the first ferromagnetic layer.

The magnetic memory is, for example, an integrated SOT-MTJ. A magnetization direction of the magnetization free layer that holds data of SOT-MTJ reverses whenever data is rewritten. In this case, a magnetic field is generated from the magnetization free layer, and the generated magnetic field is applied to another adjacent SOT-MTJ. Therefore, a magnetic memory with an integrated SOT-MTJ has problems in that a magnetic field from the adjacent SOT-MTJ cannot be ignored, a probability of a magnetization reversal changes, and rewriting of data occurs.

The present invention has been made in view of the above circumstances, and an object of the present invention is to provide a spin current magnetization rotation magnetoresistance effect element that can reduce an influence of generation of a magnetic field on other elements.

In order to address the above problems, the following aspects are provided.

A spin current magnetization rotation magnetoresistance effect element according to a first aspect includes a spin-orbit torque wiring layer, a first ferromagnetic layer, an antiferromagnetic coupling layer, a second ferromagnetic layer, a nonmagnetic layer, and a magnetization reference layer, in an order, wherein a magnitude of the product of the saturation magnetization of the first ferromagnetic layer and the film thickness of the first ferromagnetic layer is larger than a magnitude of the product of the saturation magnetization of the second ferromagnetic layer and the film thickness of the second ferromagnetic layer.

In an SOT-MTJ element according to a first aspect, a magnetic field generated from the first ferromagnetic layer and a magnetic field generated from the second ferromagnetic layer are cancelled out in the element. That is, the magnetic field generated from the first ferromagnetic layer and the magnetic field generated from the second ferromagnetic layer have a relationship in which they weaken each other. As a result, the magnetic field emitted from the SOT-MTJ weakens and the influence of the magnetic field applied to the adjacent SOT-MTJ is reduced. In addition, a product of the saturation magnetization of the first ferromagnetic layer and the film thickness thereof is made larger than a product of the saturation magnetization of the second ferromagnetic layer and the film thickness thereof. Therefore, the influence of the magnetic flux on the magnetization reference layer can be reduced and variation in the magnetization of the magnetization reference layer can be reduced. Therefore, regardless of the magnetization direction of the second ferromagnetic layer, the magnetization direction of the magnetization reference layer is stable, and the magnetization can be held.

The first ferromagnetic layer preferably has a lower spin resistance than the second ferromagnetic layer. The spin current tends to flow toward a layer with a lower spin resistance. When the spin current is concentrated on the first ferromagnetic layer, magnetization rotation of the first ferromagnetic layer becomes easier.

Preferably, an area of a first surface of the first ferromagnetic layer positioned on the side of the spin-orbit torque wiring layer is larger than an area of a second surface of the second ferromagnetic layer positioned on the side of the nonmagnetic layer. When the area of the first ferromagnetic layer is larger, the volume also increases, and an ability to hold data is improved.

Preferably, the first ferromagnetic layer contains an alloy containing at least one element selected from the group consisting of Co, Fe, and Ni and at least one rare earth element. When the spin diffusion length of the first ferromagnetic layer becomes short, a spin current generated from the spin-orbit torque wiring layer is absorbed in the first ferromagnetic layer, and is unlikely to reach the second ferromagnetic layer, and desired magnetization rotation easily occurs. When a spin current reaches the second ferromagnetic layer, it prevents the magnetization rotation because since the magnetization direction is opposite to the magnetization direction of the first ferromagnetic layer.

Preferably, the first ferromagnetic layer contains a CoPt alloy, a FePt alloy, a CoPd alloy, a FePd alloy, a CoCrPt alloy, a HoFe alloy, or a SmFe alloy. Since such a material has strong magneto-crystalline anisotropy, even if the size of the spin current magnetization rotation magnetoresistance effect element is reduced, data can be stably held.

Preferably, the thickness of the first ferromagnetic layer is thinner than the thickness of the second ferromagnetic layer. When the thickness of the second ferromagnetic layer is thicker, the magnetoresistance ratio of SOT-MTJ increases. In addition, when the thickness of the second ferromagnetic layer is thicker, the magnetization reference layer is unlikely to be influenced by the magnetization of the first ferromagnetic layer.

Preferably, the nonmagnetic layer is made of a material having a spinel crystal structure. The durability of the SOT-MTJ is improved when a write current is applied to the spin-orbit torque wiring layer. Even if application is performed for a long time or with a strong load, the SOT-MTJ is unlikely to fail.

A magnetic memory according to a second aspect includes a plurality of spin current magnetization rotation magnetoresistance effect elements. In the magnetic memory, data can be written at a high speed, and an SRAM can be replaced with a nonvolatile high-speed memory. When data is made nonvolatile, standby power consumption can be made zero, and power consumption of the magnetic memory (integrated element) can be reduced.

In the magnetic memory according to the above aspect, an easy magnetization axial direction of a first ferromagnetic layer and a second ferromagnetic layer constituting a first spin current magnetization rotation magnetoresistance effect element is a first direction, and a direction, in which the first spin current magnetization rotation magnetoresistance effect element and a second spin current magnetization rotation magnetoresistance effect element closest thereto are connected, may be different from the first direction. It can be made unlikely for an influence from the nearest element to be received, and it is possible to inhibit change in a probability of a magnetization reversal and change in an ability to hold data.

According to the present invention, it is possible to provide a spin current magnetization rotation magnetoresistance effect element that can reduce an influence of generation of a magnetic field on other elements.

DETAILED DESCRIPTION OF THE INVENTION

Figure 1:
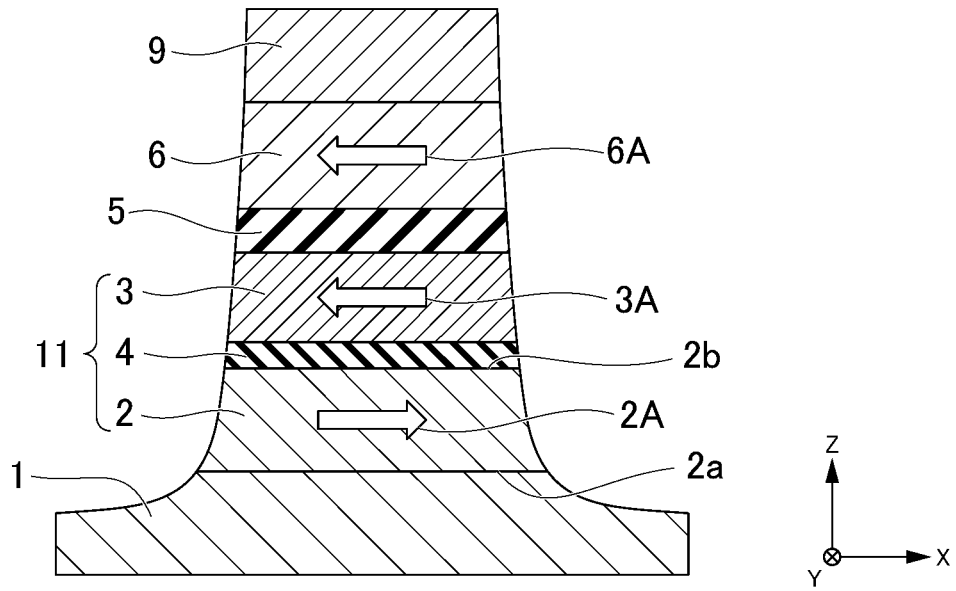
FIG. 1 is a schematic diagram showing a laminated structure of a spin current magnetization rotation magnetoresistance effect element 100 according to a first embodiment.

Embodiments of the present invention will be described below in detail with reference to the appended drawings. Here, the same components in descriptions of the drawings are denoted with the same reference numerals, and redundant descriptions will be omitted. Up, down, left, and right refer to positional relationships in the drawings.

First Embodiment

Hereinafter, regarding a spin current magnetization rotation magnetoresistance effect element 100 according to a first embodiment, a form in which a magnetization reference layer 6 is composed of the simplest single layer is shown. Here, it is described that a magnetic flux from the magnetization reference layer 6 is sufficiently low, and only the influence of a magnetic flux generated from a magnetic recording layer 11 should be considered. An orientation direction of the magnetization of the magnetization reference layer 6 is less likely to change than that of the magnetization of the magnetic recording layer 11 when a predetermined external force is applied. The magnetic recording layer 11 is also referred to as a magnetization free layer.

(Basic Structure)

The spin current magnetization rotation magnetoresistance effect element 100 has a structure in which a spin-orbit torque wiring layer 1, a first ferromagnetic layer 2, an antiferromagnetic coupling layer 4, a second ferromagnetic layer 3, a nonmagnetic layer 5, and the magnetization reference layer 6 are laminated in order in the Z direction. The spin-orbit torque wiring layer 1 extends in the XY plane. The spin-orbit torque wiring layer 1 extends in, for example, the X direction. A layer above the first ferromagnetic layer 2 has a structure that narrows away from the spin-orbit torque wiring layer 1. That is, the outer peripheral lengths or outer diameters of the first ferromagnetic layer 2, the antiferromagnetic coupling layer 4, the second ferromagnetic layer 3, the nonmagnetic layer 5 and the magnetization reference layer 6 decrease away from the spin-orbit torque wiring layer 1.

<Magnetic Recording Layer (Magnetization Free Layer)>

The magnetic recording layer 11 has the first ferromagnetic layer 2, the second ferromagnetic layer 3, and the antiferromagnetic coupling layer 4. The first ferromagnetic layer 2 and the second ferromagnetic layer 3 are antiferromagnetically coupled by the antiferromagnetic coupling layer 4. A magnetic flux generated from each of the first ferromagnetic layer 2 and the second ferromagnetic layer 3 forms a loop connecting the first ferromagnetic layer 2 and the second ferromagnetic layer 3. A magnetization vector 11A of the entire magnetic recording layer 11 is a difference between a magnetization vector 2A of the first ferromagnetic layer 2 and a magnetization vector 3A of the second ferromagnetic layer 3 (refer to FIG. 4A and FIG. 4B). When respective film thicknesses and materials of the first ferromagnetic layer 2 and the second ferromagnetic layer 3 are adjusted, it is possible to make a magnetic flux generated outward from substantially one magnetic recording layer 11 approach zero.

In a relationship in which a magnetic field from the first ferromagnetic layer 2 and a magnetic field from the second ferromagnetic layer 3 weaken each other, a magnetic field emitted from one spin current magnetization rotation magnetoresistance effect element 100 becomes weak. That is, it is possible to reduce the influence of a magnetic field generated from one spin current magnetization rotation magnetoresistance effect element 100 on other adjacent spin current magnetization rotation magnetoresistance effect elements. In addition, when a magnitude of the product of the saturation magnetization of the first ferromagnetic layer 2 and a film thickness thereof is made larger than a magnitude of the product of the saturation magnetization of the second ferromagnetic layer 3 and a film thickness thereof, it is possible to reduce the influence of the magnetic flux on the magnetization reference layer 6. When the influence of the magnetic flux on the magnetization reference layer 6 is reduced, it is possible to reduce variation of the magnetization of the magnetization reference layer 6. Therefore, regardless of the magnetization direction of the second ferromagnetic layer 3, the magnetization direction of the magnetization reference layer 6 is stable, and data can be stably held.

A ferromagnetic material, particularly, a soft magnetic material can be applied to the first ferromagnetic layer 2 and the second ferromagnetic layer 3. For example, a metal selected from the group consisting of Cr, Mn, Co, Fe and Ni, alloys containing one or more of such metals, alloys containing such metals and at least one element of B, C, and N, and the like can be applied to the first ferromagnetic layer 2 and the second ferromagnetic layer 3. The first ferromagnetic layer 2 and the second ferromagnetic layer 3 preferably contain an alloy containing at least one element selected from among Co, Fe, and Ni and at least one rare earth element. The first ferromagnetic layer 2 and the second ferromagnetic layer 3 may contain, for example, a CoPt alloy, a FePt alloy, a CoPd alloy, a FePd alloy, a CoCrPt alloy, a HoFe alloy, or a SmFe alloy. The first ferromagnetic layer 2 and the second ferromagnetic layer 3 may be of, for example, Co—Fe, Co—Fe—B, Ni—Fe, Co—Pt, Fe—Pt, Co—Pt, Fe—Pt, Co—Cr—Pt, Sm—Fe, or Ho—Fe.

In addition, the first ferromagnetic layer 2 may contain a Heusler alloy. Heusler alloys have high spin polarization, and can provide a larger output. A Heusler alloy contains an intermetallic compound having a chemical composition of XYZ or $X_2YZ$. In the periodic table, X is a transition metal element from the Co, Fe, Ni, or Cu groups or a noble metal element, Y is a transition metal from the Mn, V, Cr or Ti groups or an element of type X, and Z is a typical element from Group III to Group V. Examples of Heusler alloys include $Co_2FeSi$, $Co_2FeGe$, $Co_2FeGa$, $Co_2MnSi$, $Co_2Mn_{1-a}Fe_aAl_bSi_{1-b}$, and $Co_2FeGe_{1-c}Ga_c$.

<Spin-Orbit Torque Wiring Layer>

The spin-orbit torque wiring layer 1 extends in the XY plane. The spin-orbit torque wiring layer 1 is connected to, for example, one surface of the first ferromagnetic layer 2 in the Z direction. The spin-orbit torque wiring layer 1 may be directly connected to the first ferromagnetic layer 2 or may be connected via another layer.

The spin-orbit torque wiring layer 1 is made of, for example, a material in which a pure spin current is generated due to a spin Hall effect when a current flows. As such a material, a material having a configuration in which a pure spin current is generated in the spin-orbit torque wiring layer 1 is sufficient. Therefore, the spin-orbit torque wiring layer 1 is not limited to a material including a single element, and it may include a part made of a material in which a pure spin current is easily generated and a part made of a material in which a pure spin current is unlikely to be generated.

The spin Hall effect is a phenomenon in which, when a current flows, a spin current is induced in a direction orthogonal to a direction of the current based on a spin-orbit interaction. A mechanism in which a spin current is generated due to the spin Hall effect will be described.

For example, when a potential difference is provided at both ends of the spin-orbit torque wiring layer 1 in the X direction, a current flows in the X direction. When a current flows, a first spin S1 directed in the Y direction and a second spin S2 directed in the −Y direction are bent in directions (Z direction) orthogonal to the current. For example, a direction of travel of the first spin S1 is bent in the +Z direction, and a direction of travel of the second spin S2 is bent in the −Z direction. The general Hall effect and the spin Hall effect are the same in that mobile (moving) charges (electrons) are bent in the direction of motion (movement). On the other hand, the general Hall effect and the spin Hall effect are greatly different in that charged particles that move in a magnetic field receive a Lorentz force and are bent in a movement direction in the general Hall effect, but a movement direction of a spin is bent only by movement of electrons (only when a current flows) without there being a magnetic field in the spin Hall effect.

The number of electrons with the first spin S1 and the number of electrons with the second spin S2 are the same in a nonmagnetic material (a material that is not a ferromagnetic material). That is, the number of electrons with the first spin S1 in the upward direction (+Z direction) and the number of electrons with the second spin S2 in the downward direction (−Z direction) are the same. Therefore, a current of a net flow of charges becomes zero. A spin current that occurs without this current is specifically called a pure spin current.

There is a common point that, when a current flows through a ferromagnetic material, the first spin S1 and the second spin S2 are bent in directions opposite to each other. On the other hand, there is a difference that, in the ferromagnetic material, one of the first spin S1 and the second spin S2 outnumbers the other, and as a result, a net flow of charges occurs (a voltage is generated). Thus, a material composed of only a ferromagnetic material is not included as the material of the spin-orbit torque wiring layer 1.

Here, when a flow of electrons with the first spin S1 is denoted as $J_\uparrow$, a flow of electrons with the second spin S2 is denoted as $J_\downarrow$, and a spin current is denoted as $J_S$, $J_S = J_\uparrow - J_\downarrow$ is defined. A pure spin current $J_S$ flows in the Z direction in the drawing. Here, $J_S$ is a flow of electrons with a polarization of 100%. In FIG. 1, when the first ferromagnetic layer 2 is brought into contact with the upper surface of the spin-orbit torque wiring layer 1, a pure spin current diffuses and flows through the ferromagnetic material. That is, spins are injected into the first ferromagnetic layer 2.

The spin-orbit torque wiring layer 1 is made of any of a metal, an alloy, an intermetallic compound, a metal boride, a metal carbide, a metal silicide, and a metal phosphide having a function of generating a pure spin current due to the spin Hall effect when a current flows.

The main component of the spin-orbit torque wiring layer 1 is preferably a nonmagnetic heavy metal. Here, a heavy metal refers to a metal having a specific gravity that is equal to or higher than that of yttrium. The nonmagnetic heavy metal is preferably a nonmagnetic metal including d electrons or f electrons in the outermost shell and having a large atomic number of 39 or more. The spin-orbit torque wiring layer 1 contains, for example, Hf, Ta, or W. Such a nonmagnetic metal has a strong spin-orbit interaction causing the spin Hall effect.

Generally, when a current flows in a metal, all the electrons move in a direction opposite to the current irrespective of the direction of the spin. On the other hand, a nonmagnetic metal including d electrons or f electrons in the outermost shell and having a large atomic number has a strong spin-orbit interaction, the spin Hall effect is strongly exhibited, and a direction of movement of electrons depends on a direction of the spin of the electrons. As a result, a pure spin current $J_s$ is likely to be generated in such a nonmagnetic metal.

In addition, the spin-orbit torque wiring layer 1 may contain a magnetic metal. The magnetic metal refers to a ferromagnetic metal or an antiferromagnetic metal. When a small amount of a magnetic metal is contained in the nonmagnetic metal, this serves as a spin scattering factor. When spins are scattered, the spin-orbit interaction is enhanced and the spin current generation efficiency for a current increases. The main component of the spin-orbit torque wiring layer 1 may be only an antiferromagnetic metal.

On the other hand, when an amount of a magnetic metal added is too large, a generated pure spin current is scattered by the added magnetic metal, and as a result, an effect of decreasing a spin current may be strong. Therefore, preferably, a molar ratio of the added magnetic metal is sufficiently smaller than a total molar ratio of elements constituting the spin-orbit torque wiring layer. As a guideline, a molar ratio of the added magnetic metal is preferably 3% or less.

In addition, the spin-orbit torque wiring layer 1 may contain a topological insulator. The main component of the spin-orbit torque wiring layer 1 may be a topological insulator. A topological insulator is a substance which includes an insulator or a high resistance component therein and has a surface in a spin-polarized metallic state. In the topological insulator, an internal magnetic field is generated due to a spin-orbit interaction. In the topological insulator, even if there is no external magnetic field, a new topological phase is exhibited due to an effect of the spin-orbit interaction. In the topological insulator, due to a strong spin-orbit interaction and breaking of inversion symmetry at the edge, a pure spin current can be generated with high efficiency.

The topological insulator is made of, for example, SnTe, $Bi_{1.5}Sb_{0.5}Te_{1.7}Se_{1.3}$, $TlBiSe_2$, $Bi_2Te_3$, $Bi_{1-x}Sb_x$, or $(Bi_{1-x}Sb_x)_2Te_3$. Such topological insulators can generate a spin current with high efficiency.

(Antiferromagnetic Coupling Layer)

The antiferromagnetic coupling layer 4 contains, for example, Ru or Ir. When the film thickness of the antiferromagnetic coupling layer 4 is set, an antiferromagnetic coupling is provided between ferromagnetic layers (the first ferromagnetic layer 2 and the second ferromagnetic layer 3) in contact with the antiferromagnetic coupling layer, and directions of the magnetization vectors 2A and 3A are opposite to each other.

Figure 4A:
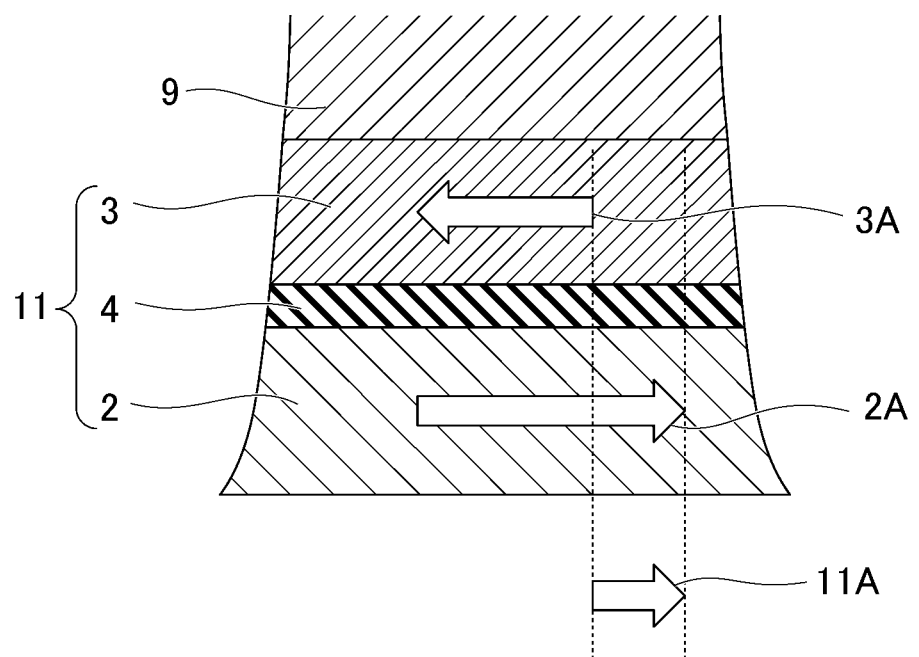
FIG. 4A is a schematic diagram showing a laminated structure of a magnetic recording layer 11 when a magnetization vector 2A of a first ferromagnetic layer 2 is larger than a magnetization vector 3A of a second ferromagnetic layer 3.
Figure 4B:
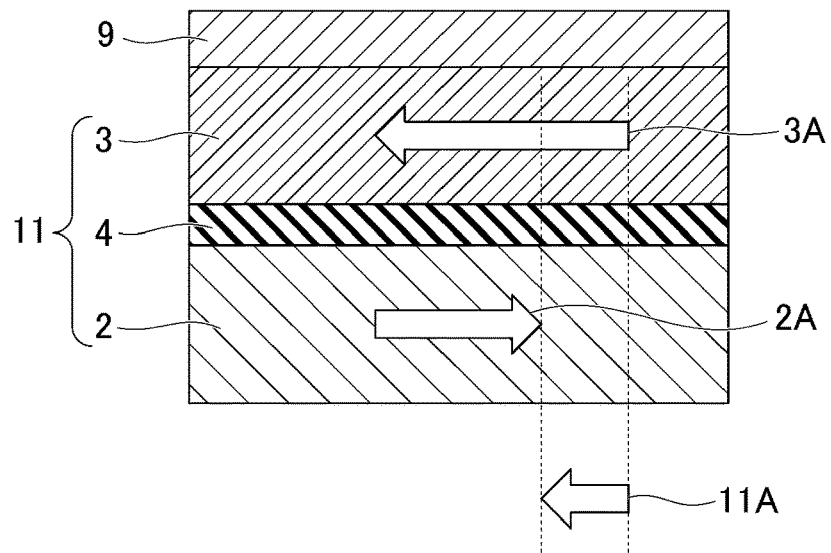
FIG. 4B is a schematic diagram showing a laminated structure of the magnetic recording layer 11 when the magnetization vector 3A of the second ferromagnetic layer 3 is larger than the magnetization vector 2A of the first ferromagnetic layer 2.
Figure 5:
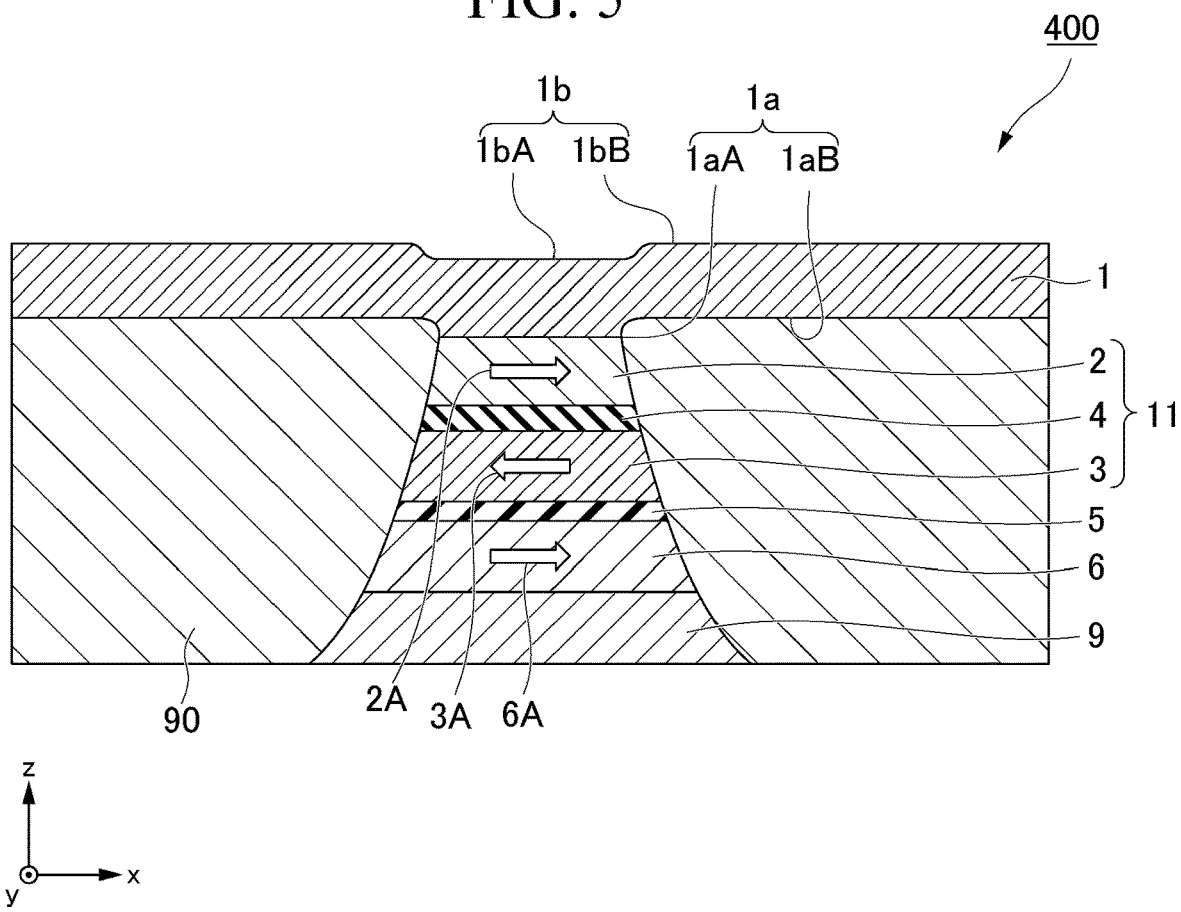
FIG. 5 is a schematic diagram showing a laminated structure of a spin current magnetization rotation magnetoresistance effect element 400 according to a fourth embodiment.

FIG. 4A and FIG. 4B show antiferromagnetic coupling in the magnetic recording layer 11. In the magnetic recording layer 11, since the magnetization vector 2A of the first ferromagnetic layer 2 and the magnetization vector 3A of the second ferromagnetic layer 3 are antiferromagnetically coupled, they face in opposite directions. In FIG. 4A, the magnetization vector 2A of the first ferromagnetic layer 2 is larger than the magnetization vector 3A of the second ferromagnetic layer 3, and as a result, the magnetization vector 11A of the magnetic recording layer 11 has the same direction as the magnetization vector 2A of the first ferromagnetic layer. On the other hand, in FIG. 4B, the magnetization vector 3A of the second ferromagnetic layer 3 is larger than the magnetization vector 2A of the first ferromagnetic layer 2, and the magnetization vector 11A of the magnetic recording layer 11 has the same direction as the magnetization vector 3A of the second ferromagnetic layer.

(Nonmagnetic Layer)

A known material can be used for the nonmagnetic layer 5. For example, when the nonmagnetic layer 5 is made of an insulator (that is, when it is a tunnel barrier layer), $Al_2O_3$, $SiO_2$, Mg, $MgAl_2O_4$, and the like can be used as its material. In addition to these materials, materials in which some of Al, Si, and Mg are replaced with Zn, Be, and the like can be used for the nonmagnetic layer 5. Among these, since MgO and MgAl$_2$O$_4$ are materials that can realize coherent tunneling, spins can be injected efficiently. In addition, MgAl$_2$O$_4$ having a spinel crystal structure is superior in durability when a current is applied to the tunnel barrier layer to MgO, and allows a product to be guaranteed for a long time. In addition, when the nonmagnetic layer 5 is made of a metal, Cu, Au, Ag, and the like can be used as its material.

(Cap Layer)

A material having high conductivity is preferably used for a cap layer 9. For example, Ru, Ta, Cu, Ag, Au, or the like can be used. Preferably, a crystal structure of the cap layer 9 is appropriately set from among a face centered cubic (fcc) structure, a hexagonal close packing (hcp) structure or a body-centered cubic (bcc) structure according to the crystal structure of the adjacent ferromagnetic metal layer.

(Element Shape)

In the spin current magnetization rotation magnetoresistance effect element 100 shown in FIG. 1, it is preferable that an area of a first surface 2a in contact with the spin-orbit torque wiring layer 1 of the first ferromagnetic layer 2 be larger than an area of a second surface 2b in contact with the nonmagnetic layer 5 of the second ferromagnetic layer 3. When the area of the first ferromagnetic layer 2 increases, since the volume of the magnetic recording layer 11 can increase, an ability to hold data can be improved.

(First Ferromagnetic Layer and Second Ferromagnetic Layer)

The first ferromagnetic layer 2 is preferably made of a ferromagnetic material containing a rare earth element. The second ferromagnetic layer 3 is preferably made of a ferromagnetic material containing Fe. The ferromagnetic material containing a rare earth element has strong magneto-crystalline anisotropy and can stably hold data even if the size of the spin current magnetization rotation magnetoresistance effect element 100 is reduced. In addition, when the first ferromagnetic layer 2 contains a rare earth element, the spin-orbit interaction in the first ferromagnetic layer 2 becomes strong, and the spin diffusion length of the first ferromagnetic layer 2 becomes short. Since the second ferromagnetic layer 3 is a ferromagnetic material containing Fe, when the nonmagnetic layer 5 is made of MgO or MgAl$_2$O$_4$, coherent tunneling can be realized. As a result, the magnetoresistance ratio of the spin current magnetization rotation magnetoresistance effect element 100 increases.

(Spin Resistance, Spin Resistivity)

Spin resistance is an amount quantitatively indicating ease of flow of a spin current (difficulty of spin relaxation). Non Patent Document 2 discloses a theoretical treatment of the spin resistance. At the interface between substances with different spin resistances, spin current reflection (return) occurs. That is, only a part of spin current is injected from a material with a low spin resistance to a material with a high spin resistance.

The spin resistance Rs is defined by the following formula (refer to Non Patent Document 2).

[Math. 1]
$$R_s \equiv \frac{\rho \lambda}{A} \quad (1)$$

Here, $\lambda$ is a spin diffusion length of a material, $\rho$ is an electrical resistivity of a material, and A is a cross-sectional area of a material.

In a nonmagnetic material, when the cross-sectional area A is the same, a magnitude of the spin resistance is determined by a value of $\rho\lambda$, which is spin resistivity, in Formula (1).

In the first embodiment, when the first ferromagnetic layer 2 is a ferromagnetic material containing a rare earth element and the second ferromagnetic layer 3 is a ferromagnetic material containing Fe, the first ferromagnetic layer 2 absorbs a spin current generated from the spin-orbit torque wiring layer 1. When a spin current is absorbed in the first ferromagnetic layer 2 and a spin-orbit torque according to a spin current does not sufficiently act on magnetization rotation of the first ferromagnetic layer 2, a part of the spin current reaches the second ferromagnetic layer 3. When the spin current reaches the second ferromagnetic layer 3, the spin current allows the magnetization of the first ferromagnetic layer 2 to orient in the same direction in which the magnetization of the second ferromagnetic layer 3 is oriented. In this case, since directions of the magnetizations of the first ferromagnetic layer 2 and the second ferromagnetic layer 3 are opposite, the magnetization rotation of the second ferromagnetic layer 3 inhibits magnetization rotation of the first ferromagnetic layer 2. Therefore, it is preferable that the first ferromagnetic layer 2 have a low spin resistance and easily absorb a spin current generated from the spin-orbit torque wiring layer 1. In addition, the second ferromagnetic layer 3 is in contact with the nonmagnetic layer 5, and coherent tunneling is realized, and thereby a high magnetoresistance ratio can be obtained. A Fe-based ferromagnetic material is preferable in order to cause coherent tunneling, and when the second ferromagnetic layer 3 is made of a ferromagnetic material containing Fe, the spin current magnetization rotation magnetoresistance effect element 100 exhibits a high magnetoresistance ratio.

The first ferromagnetic layer 2 preferably contains a CoFe alloy, a FePt alloy, a CoPd alloy, a FePd alloy, a CoCrPt alloy, a HoFe alloy, or a SmFe alloy. In particular, SmFe$_{12}$ and HoFe$_2$ are preferable. Such materials are tetragonal crystals having a c axis as the major axis and materials having strong magneto-crystalline anisotropy in the c axis direction. Due to the strong magneto-crystalline anisotropy, even if the size of the spin current magnetization rotation magnetoresistance effect element 100 is small, data can be stably held.

It is preferable that the thickness of the first ferromagnetic layer 2 be thinner than the thickness of the second ferromagnetic layer 3. When the first ferromagnetic layer 2 contains a rare earth element, the saturation magnetization of the first ferromagnetic layer 2 increases. When the second ferromagnetic layer 3 does not contain a rare earth element, the first ferromagnetic layer 2 can generate a magnetic field equivalent to that of the second ferromagnetic layer 3 with a film thickness thinner than that of the second ferromagnetic layer 3. That is, even if the thickness of the first ferromagnetic layer 2 is thinner than the thickness of the second ferromagnetic layer 3, a magnetic field generated from the first ferromagnetic layer 2 and a magnetic field generated from the second ferromagnetic layer 3 can be cancelled out. In addition, when the second ferromagnetic layer 3 is thickened, the magnetoresistance ratio of the spin current magnetization rotation magnetoresistance effect element 100 during reading can increase. When the second ferromagnetic layer 3 is thickened, a spin polarization current from the magnetization reference layer 6 can be sufficiently relaxed by the second ferromagnetic layer 3 and can contribute to increasing the resistance as magnetic scattering.

(Evaluation Method)

In the spin current magnetization rotation magnetoresistance effect element 100, a difference of a relative angle between the magnetization vectors 3A and 6A of the second ferromagnetic layer 3 and the magnetization reference layer 6 is evaluated as a resistance value. For example, a current source is connected to both ends of the spin-orbit torque wiring layer 1 in the XY plane and a current flows. When a current value of the current source is sufficient, the magnetization of the first ferromagnetic layer 2 is inverted due to the spin current generated from the spin-orbit torque wiring layer 1. Since the magnetization vector 3A of the second ferromagnetic layer 3 is magnetically coupled by the first ferromagnetic layer 2 and the antiferromagnetic coupling layer 4, it is inverted in a direction opposite to that of the magnetization vector 2A of the first ferromagnetic layer 2. When a current source and a voltmeter are installed at both ends of the spin-orbit torque wiring layer 1 and the magnetization reference layer 6, and a constant current or a constant voltage is applied to the spin current magnetization rotation magnetoresistance effect element 100 to evaluate a resistance, a relative angle between the magnetization vectors 3A and 6A of the second ferromagnetic layer 3 and the magnetization reference layer 6 can be evaluated. In addition, when measurement is performed while sweeping a magnetic field from the outside, change in resistance of the spin current magnetization rotation magnetoresistance effect element 100 can be observed. A relative angle between the magnetizations of the second ferromagnetic layer 3 and the magnetization reference layer 6 can be evaluated from a maximum value and a minimum value of the resistance value.

The MR ratio is generally represented by the following formula.

MR ratio(%)=$(R_{AP}-R_P)/R_P \times 100$ $R_P$ is a resistance when directions of the magnetizations of the second ferromagnetic layer 3 and the magnetization reference layer 6 are parallel to each other, and $R_{AP}$ is a resistance when direction of the magnetizations of the second ferromagnetic layer 3 and the magnetization reference layer 6 are antiparallel.

Second Embodiment

Figure 2:
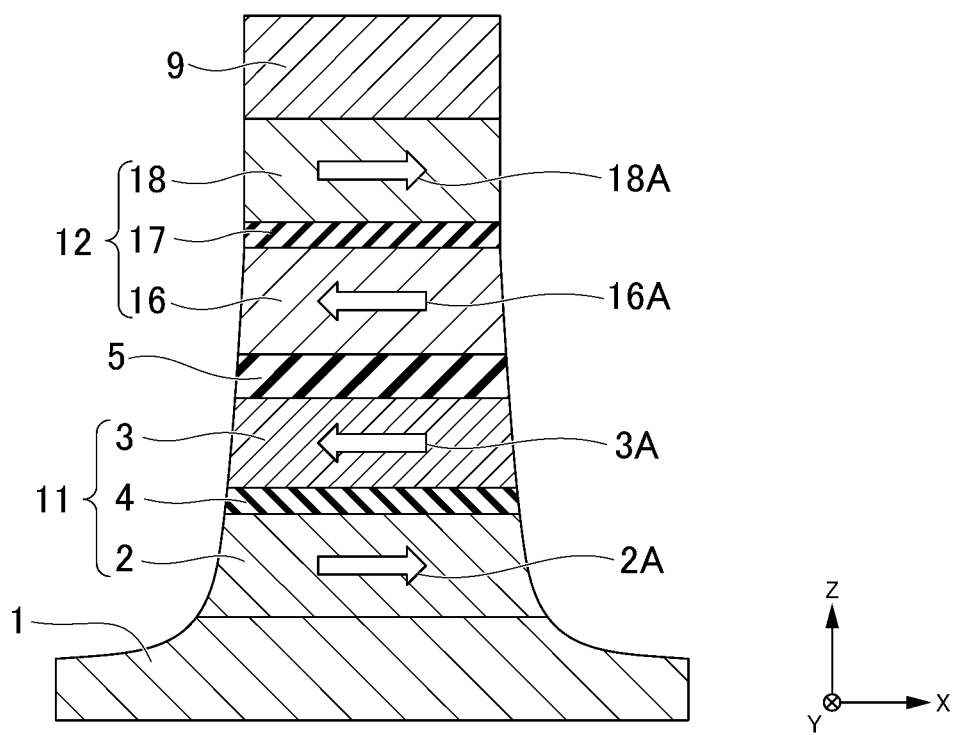
FIG. 2 is a schematic diagram showing a laminated structure of a spin current magnetization rotation magnetoresistance effect element 200 according to a second embodiment.

A spin current magnetization rotation magnetoresistance effect element 200 according to a second embodiment is similar to that of the first embodiment. Components the same as in the first embodiment are denoted with the same reference numerals and descriptions thereof will be omitted. The spin current magnetization rotation magnetoresistance effect element 200 has a magnetization reference layer 12 having a configuration that is different from that of the spin current magnetization rotation magnetoresistance effect element 100 according to the first embodiment. The magnetization reference layer 12 has a first magnetization reference layer 16, a second antiferromagnetic coupling layer 17, and a second magnetization reference layer 18 in order from the spin-orbit torque wiring layer 1. The first magnetization reference layer 16 and the second magnetization reference layer 18 are antiferromagnetically coupled by the second antiferromagnetic coupling layer 17. As shown in FIG. 2, directions of the magnetizations 16A and 18A of the first magnetization reference layer 16 and the second magnetization reference layer 18 are opposite to each other. According to this structure, as in the magnetic recording layer 11, the net magnetization of the entire magnetization reference layer 12 can approach zero, and the influence of a magnetic flux generated from the magnetization reference layer 12 on the other spin current magnetization rotation magnetoresistance effect element can be reduced. In addition, the cap layer 9 exhibits effects of adjusting the crystal orientation of the second magnetization reference layer 18 and inducing interface magnetic anisotropy according to mixing of the electron orbit with the second magnetization reference layer 18.

Third Embodiment

Figure 3:
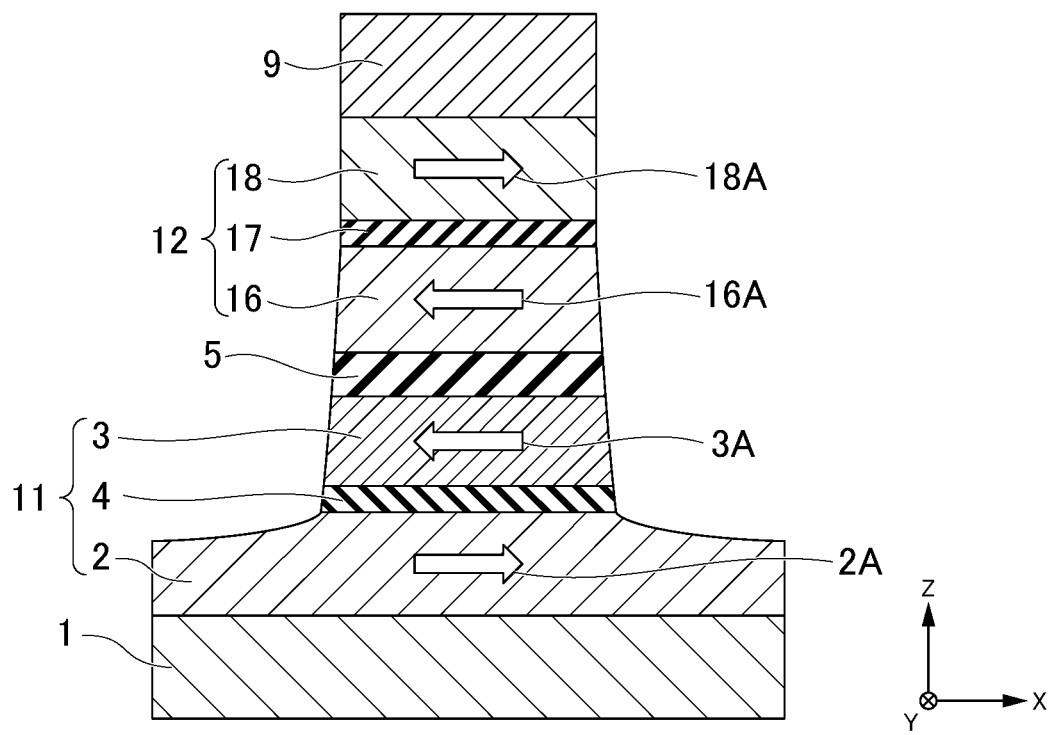
FIG. 3 is a schematic diagram showing a laminated structure of a spin current magnetization rotation magnetoresistance effect element 300 according to a third embodiment.

FIG. 3 is a diagram showing a spin current magnetization rotation magnetoresistance effect element 300 according to a third embodiment. The spin current magnetization rotation magnetoresistance effect element 300 has a structure in which the magnetization reference layer 12 is synthesized with the second antiferromagnetic coupling layer 17. In the spin current magnetization rotation magnetoresistance effect element 300, the spin-orbit torque wiring layer 1 and the first ferromagnetic layer 2 extend in the XY plane.

When the spin current magnetization rotation magnetoresistance effect element 300 is formed, it is preferable to continuously form a film in order from the spin-orbit torque wiring layer 1 to the cap layer 9 in a vacuum. This is because interface states of the layers are active and coupling of the layers becomes strong. According to continuous film formation, magnetic scattering at the interface is reduced, and magnetic coupling between adjacent layers is enhanced and conduction of spins between adjacent layers becomes efficient.

In the spin current magnetization rotation magnetoresistance effect element 300, a multi-layer film is processed into a predetermined element shape. The processing is performed by scraping off a multi-layer film according to, for example, milling. For example, a method such as reactive ion etching (RIE) is frequently used in the semiconductor process, but ion beam etching (IBE) is preferable in consideration of magnetic damage to the multi-layer film. In IBE, since accelerated ions are made to collide with the multi-layer film to remove the multi-layer film, selectivity according to elements constituting the layer is low as in RIE. Therefore, when scraping off is performed by IBE, a milling position for the multi-layer film can be estimated by reading an intensity of an IBE beam, a time, and a secondary ion mass spectrometric (SIMS) signal generated when the multi-layer film is scrapped off. The spin-orbit torque wiring layer 1 of the spin current magnetization rotation magnetoresistance effect element 300 is sufficiently thin, about 3 to 5 nm. This is because the spin diffusion length of the spin-orbit torque wiring layer 1 is about several nm, and even if a film thickness larger than this length is set, it does not contribute to magnetization rotation. In addition, when the film thickness increases, a cross-sectional area of the spin-orbit torque wiring layer 1 increases. The magnetization of the first ferromagnetic layer 2 is inverted when a current density of a current flowing through the spin-orbit torque wiring layer 1 exceeds a predetermined value (inversion current density). When the cross-sectional area of the spin-orbit torque wiring layer 1 increases, a higher current is necessary for the spin-orbit torque wiring layer 1, and power consumption increases. For the above reasons, it is necessary to process the multi-layer film by IBE and stop the processing at an arbitrary height position on the spin-orbit torque wiring layer 1. In this case, an SIMS signal generated when the antiferromagnetic coupling layer 4 is scrapped off is preferably used as a reference for a signal for stopping the processing by IBE. Ru and Ir are used for the antiferromagnetic coupling layer 4 and they are heavy metals, and a large SIMS signal can be obtained. When this signal is used as a reference, the processing of the element is stabilized and the reliability is improved. In addition, when the first ferromagnetic layer 2 extends in the XY plane, the volume of the first ferromagnetic layer 2 can increase, and an ability to hold data can be improved.

Fourth Embodiment

Figure 6:
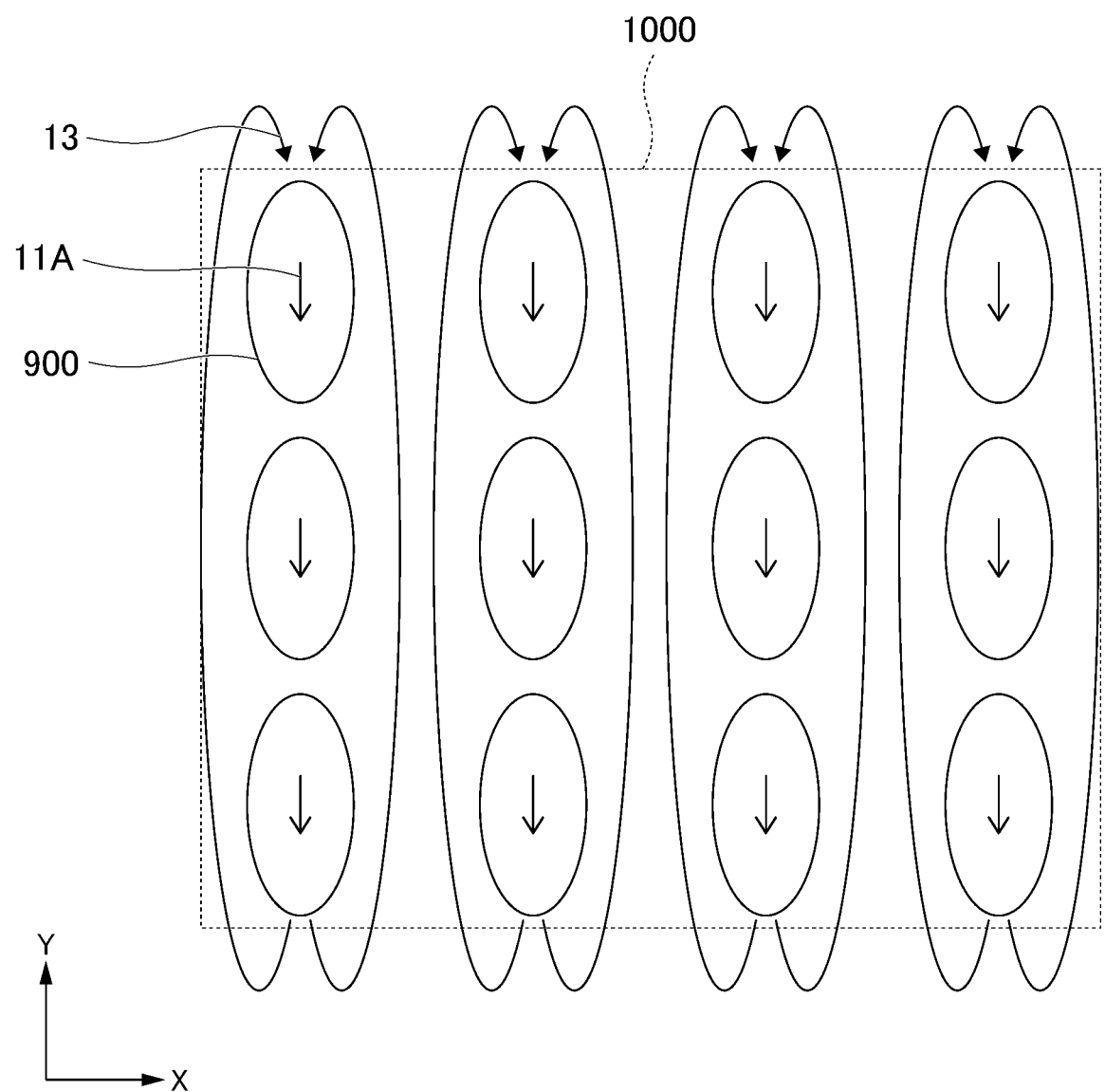
FIG. 6 is a disposition diagram of a magnetic memory according to Disposition Example 1.

FIG. 6 is a diagram showing a spin current magnetization rotation magnetoresistance effect element 400 according to a fourth embodiment. The spin current magnetization rotation magnetoresistance effect element 400 is different from the spin current magnetization rotation magnetoresistance effect element 100 according to the first embodiment in that the spin-orbit torque wiring layer 1 is positioned in the +z direction relative to the magnetic recording layer 11, the nonmagnetic layer 5, the magnetization reference layer 6, and the cap layer 9. Components the same as in the spin current magnetization rotation magnetoresistance effect element 100 are denoted with the same reference numerals, and descriptions thereof will be omitted.

In the spin current magnetization rotation magnetoresistance effect element 400, the spin-orbit torque wiring layer 1 is positioned in the +z direction relative to the magnetic recording layer 11, the nonmagnetic layer 5, the magnetization reference layer 6, and the cap layer 9. That is, the spin-orbit torque wiring layer 1 is disposed at a position further from a substrate Sub to be described below relative to the magnetic recording layer 11, the nonmagnetic layer 5, the magnetization reference layer 6 and the cap layer 9. The magnetization reference layer 6 is disposed at a position closer to the substrate Sub to be described below than the magnetic recording layer 11. The spin current magnetization rotation magnetoresistance effect element 400 has a bottom pin structure.

The spin-orbit torque wiring layer 1 is laminated at a position of the first ferromagnetic layer 2 and an insulating layer 90 in the +z direction. The insulating layer 90 is an insulating layer that insulates between wirings of the multilayer wiring or between elements. The insulating layers 90 and 91 are made of, for example, silicon oxide (SiO$_x$), silicon nitride (SiN$_x$), silicon carbide (SiC), chrome nitride, carboxy silicon nitride (SiCN), silicon oxynitride (SiON), aluminum oxide (Al$_2$O$_3$), or zirconium oxide (ZrO$_x$).

A first surface 1a and a second surface 1b of the spin-orbit torque wiring layer 1 have different height positions in the z direction depending on the location. The first surface 1a is a surface close to the side of the first ferromagnetic layer 2 of the spin-orbit torque wiring layer 1, and the second surface 1b is a surface on the side opposite to the first surface 1a. Hereinafter, within the first surface 1a, a part overlapping the first ferromagnetic layer 2 in the z direction will be referred to as a first surface 1aA, and a non-overlapping part will be referred to as a first surface 1aB. Hereinafter, within the second surface 1b, in the z direction, a part overlapping the first ferromagnetic layer 2 will be referred to as a second surface 1bA, and a non-overlapping part will be referred to as a second surface 1bB. The first surface 1aB is positioned in the +z direction relative to the first surface 1aA. In the first surface 1a, for example, due to a difference in the polishing speed during chemical mechanical polishing (CMP), the first surface 1aA is recessed in the −z direction with respect to the first surface 1aB. The second surface 1bB is positioned in the +z direction relative to the second surface 1bA. The second surface 1b reflects the shape of the first surface 1a.

Even if the spin current magnetization rotation magnetoresistance effect element 400 having the above configuration has a bottom pin structure, the same effects as in the spin current magnetization rotation magnetoresistance effect element 100 according to the first embodiment are obtained.

Fifth Embodiment

A magnetic memory 1000 can be formed by arranging and operating a plurality of spin current magnetization rotation magnetoresistance effect elements 100.

Disposition Example 1

In the magnetic memory 1000, a spin current magnetization rotation magnetoresistance effect element 900 is generally disposed in a square lattice form. FIG. 6 shows a structure in which the spin current magnetization rotation magnetoresistance effect element 900 is disposed in a square lattice form. The spin current magnetization rotation magnetoresistance effect element 900 in FIG. 6 is the same as the spin current magnetization rotation magnetoresistance effect element 100 according to the first embodiment. In addition, the magnetization vector 11A shown in FIG. 6 is a magnetization vector of the entire magnetic recording layer 11, and a difference between the magnetization vector 2A of the first ferromagnetic layer 2 and the magnetization vector 3A of the second ferromagnetic layer 3 (refer to FIG. 4A and FIG. 4B). In the spin current magnetization rotation magnetoresistance effect element 900, a write transistor and a selection transistor are necessary.

Figure 7:
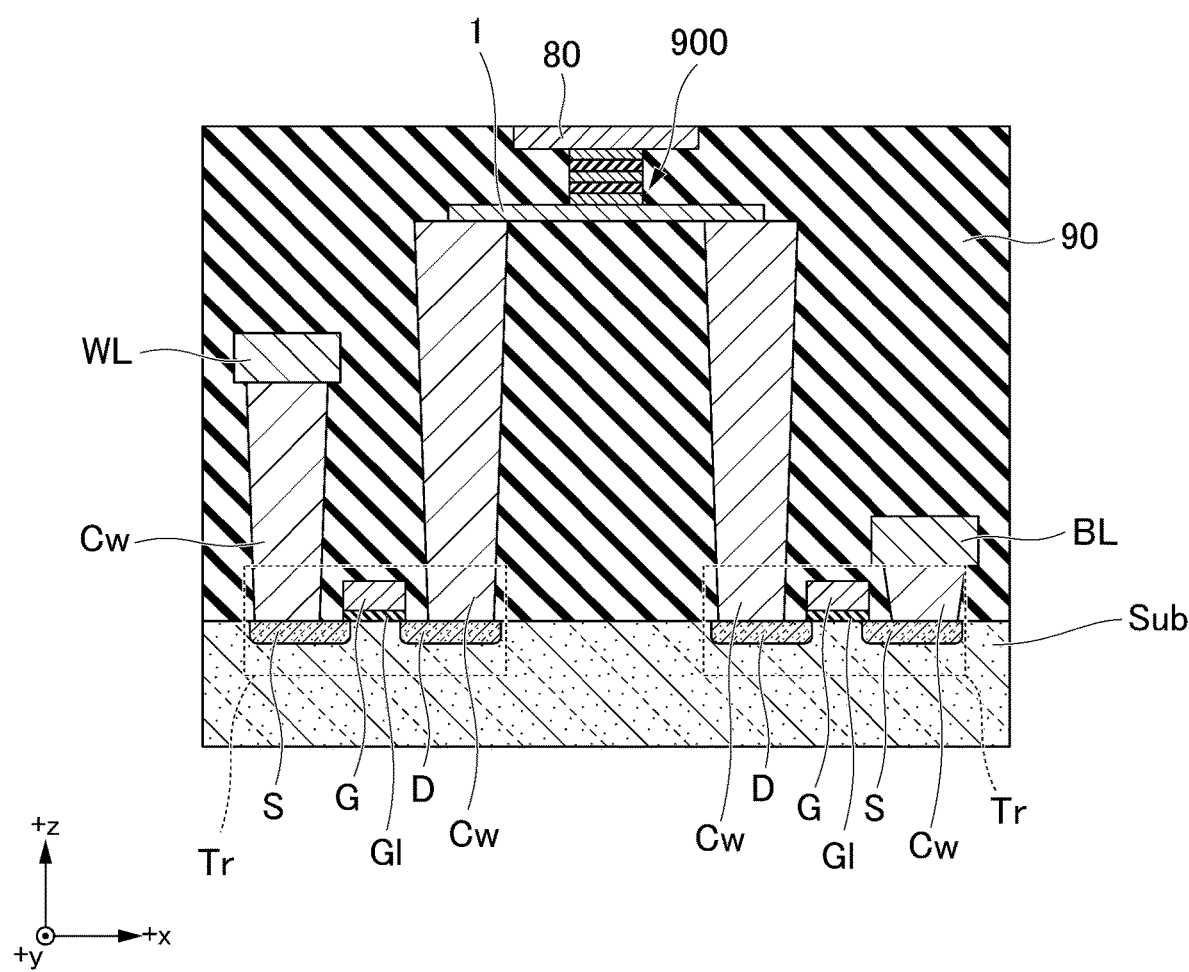
FIG. 7 is a diagram showing a peripheral structure (including a write transistor and a selection transistor) of the spin current magnetization rotation magnetoresistance effect element.

FIG. 7 is a diagram showing a peripheral structure (including a write transistor and a selection transistor) of the spin current magnetization rotation magnetoresistance effect element 900. A transistor Tr (a write transistor and a selection transistor) includes a gate electrode G, a gate insulating film GI, and a source area S and a drain area D formed on the substrate Sub. The substrate Sub is, for example, a semiconductor substrate.

Each of the transistors Tr, the spin current magnetization rotation magnetoresistance effect element 900, a word line WL and a bit line BL are electrically connected via a conductive part Cw. The conductive part Cw may be referred to as, for example, a connection wiring or a via wiring. The conductive part Cw contains a material having conductivity. The conductive part Cw extends in the z direction.

In addition, an electrode 80 is formed in the spin current magnetization rotation magnetoresistance effect element 900. The electrode 80 contains a material having conductivity. The electrode 80 is connected to a lead line. A switching element (for example, a transistor) may be provided between a lead line RL and the electrode 80. The switching element between the lead line RL and the electrode 80 is positioned, for example, in the paper depth direction (−y direction) in FIG. 7.

Since it is necessary to cause a current to flow on the XY plane of the spin-orbit torque wiring layer 1, the spin current magnetization rotation magnetoresistance effect element 900 has a structure in which one axis on the XY plane is set as a major axis. In the magnetic memory 1000 shown in FIG. 6, a direction in which a plurality of elements are arranged is the same as a direction in which the magnetization vector 11A of the magnetic recording layer 11 is oriented. In this case, magnetic fluxes penetrate the insides of respective spin current magnetization rotation magnetoresistance effect elements 900 belonging to the same row and wrap around so that the spin current magnetization rotation magnetoresistance effect elements 900 at both ends belonging to the same row are connected. In this disposition, magnetic fluxes generated from the spin current magnetization rotation magnetoresistance effect elements 900 each influence the other spin current magnetization rotation magnetoresistance effect elements. When generation of the magnetic flux from the magnetic recording layer 11 is reduced, generation of the magnetic flux can be reduced and the influence of the magnetic flux between respective elements can be reduced.

Disposition Example 2

Figure 8:
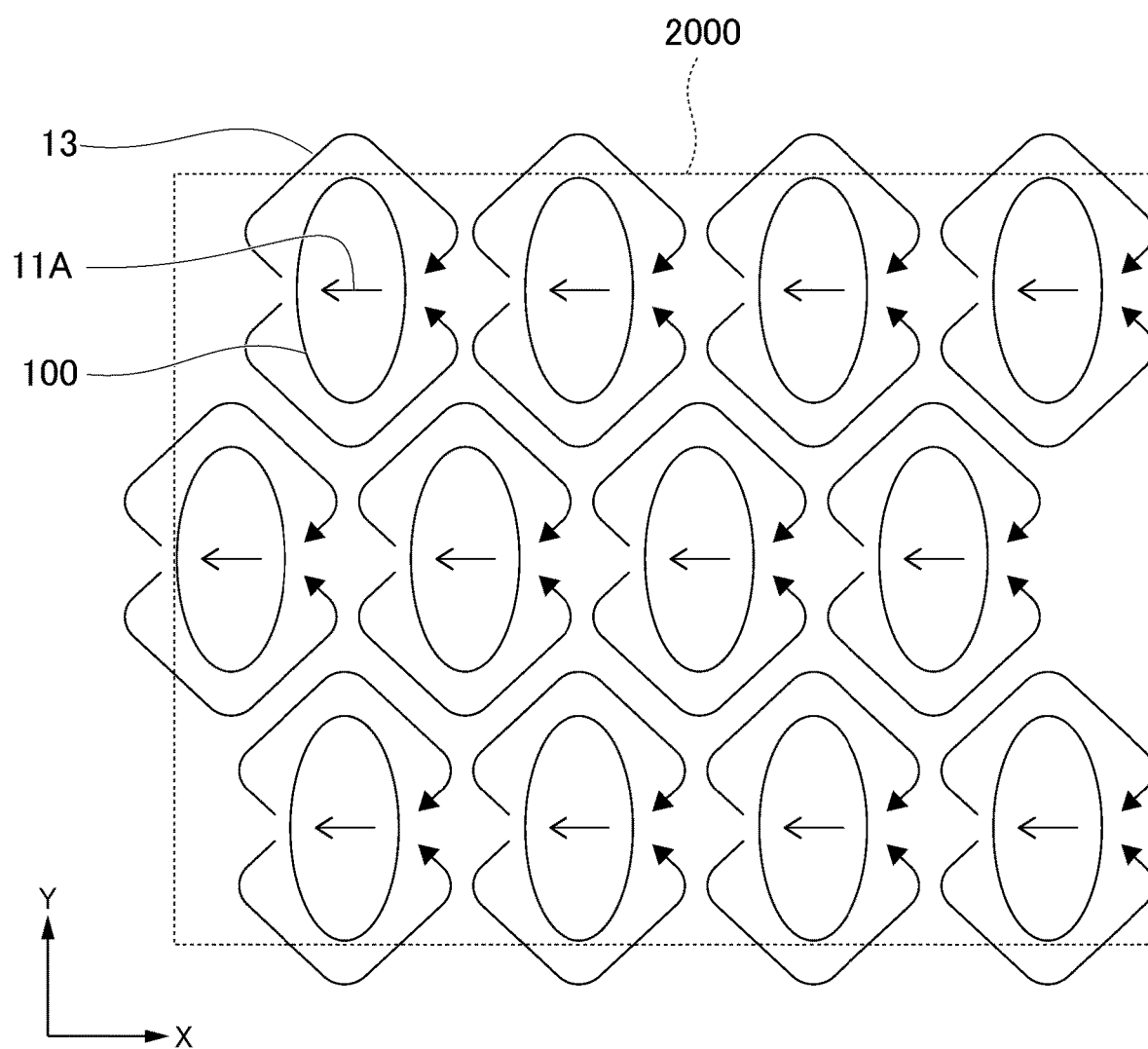
FIG. 8 shows a patchwork disposition of the spin current magnetization rotation magnetoresistance effect element 100 in Type-X.

FIG. 8 shows a magnetic memory 2000 in which a disposition method of the spin current magnetization rotation magnetoresistance effect element 100 is devised as a method of reducing the disposition problem of Disposition Example 1. In FIG. 8, the spin current magnetization rotation magnetoresistance effect elements 100 are disposed in a patchwork form. That is, the positions of the spin current magnetization rotation magnetoresistance effect elements 100 belonging to the first row aligned in the x direction and the spin current magnetization rotation magnetoresistance effect elements 100 belonging to the adjacent second row are shifted in the x direction. In Disposition Example 2, a distance between the nearest spin current magnetization rotation magnetoresistance effect elements 100 is wider than that of Disposition Example 1. According to this disposition, it is possible to reduce the influence of the magnetic flux of the spin current magnetization rotation magnetoresistance effect element 100. FIG. 8 shows a patchwork disposition of the spin current magnetization rotation magnetoresistance effect elements 100 in Type-X. The Type-X has a configuration in which the magnetization vector 11A of the entire magnetic recording layer 11 is directed in the X direction, and the spin-orbit torque wiring layer 1 extends in the X direction. The easy magnetization axial direction of the magnetic recording layer 11 of each of the spin current magnetization rotation magnetoresistance effect elements is the X direction. A direction in which the nearest spin current magnetization rotation magnetoresistance effect elements 100 are connected is a direction inclined 45° toward the Y direction from the X direction.

Disposition Example 3

Figure 9:
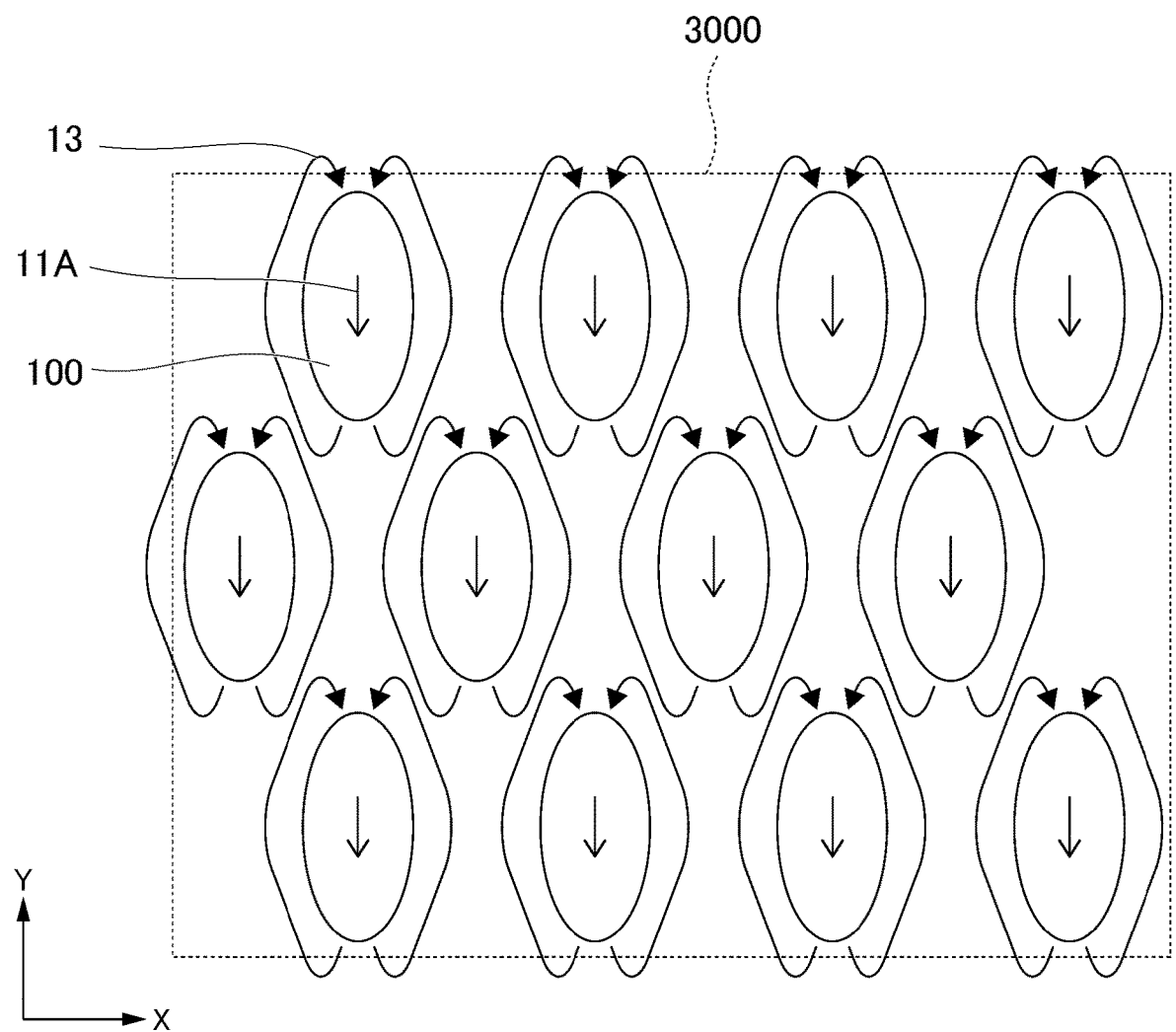
FIG. 9 shows a patchwork disposition of the spin current magnetization rotation magnetoresistance effect element 100 in Type-Y.

FIG. 9 shows a patchwork disposition of the spin current magnetization rotation magnetoresistance effect elements 100 in Type-Y. According to this disposition, it is possible to reduce the influence of the magnetic flux of the spin current magnetization rotation magnetoresistance effect element 100. The Type-Y has a configuration in which the magnetization vector 11A of the entire magnetic recording layer 11 is directed in the Y direction, and the spin-orbit torque wiring layer 1 extends in the X direction. The easy magnetization axial direction of the magnetic recording layer 11 of each of the spin current magnetization rotation magnetoresistance effect elements is the Y direction. A direction in which the nearest spin current magnetization rotation magnetoresistance effect elements 100 are connected is a direction inclined 45° toward the Y direction from the X direction.

EXPLANATION OF REFERENCES 100, 200, 300, 900 Spin current magnetization rotation magnetoresistance effect element
1 Spin orbital torque wiring layer
2 First ferromagnetic layer
2A Magnetization vector of first ferromagnetic layer
3 Second ferromagnetic layer
3A Magnetization vector of second ferromagnetic layer
4 Antiferromagnetic coupling layer
5 Nonmagnetic layer
6 Magnetization reference layer
16 First magnetization reference layer
17 Second antiferromagnetic coupling layer
18 Second magnetization reference layer
9 Cap layer
11 Magnetic recording layer
11A Magnetization vector of magnetic recording layer
12 Magnetization reference layer
13 Magnetic flux of magnetic recording layer

What is claimed is:

1. A spin current magnetization rotation magnetoresistance effect element, comprising:
   a spin-orbit torque wiring layer;
   a first ferromagnetic layer;
   an antiferromagnetic coupling layer;
   a second ferromagnetic layer;
   a nonmagnetic layer; and
   a magnetization reference layer, in an order,
   wherein a magnitude of the product of the saturation magnetization of the first ferromagnetic layer and the film thickness of the first ferromagnetic layer is larger than a magnitude of the product of the saturation magnetization of the second ferromagnetic layer and the film thickness of the second ferromagnetic layer, and
   wherein the first ferromagnetic layer has a lower spin resistance than the second ferromagnetic layer.

2. The spin current magnetization rotation magnetoresistance effect element according to claim 1,
   wherein an area of a first surface of the first ferromagnetic layer positioned on the side of the spin-orbit torque wiring layer is larger than an area of a second surface of the second ferromagnetic layer positioned on the side of the nonmagnetic layer.

3. The spin current magnetization rotation magnetoresistance effect element according to claim 1,
   wherein the first ferromagnetic layer contains an alloy containing at least one element selected from among Co, Fe, and Ni and at least one rare earth element.

4. The spin current magnetization rotation magnetoresistance effect element according to claim 2,
   wherein the first ferromagnetic layer contains an alloy containing at least one element selected from among Co, Fe, and Ni and at least one rare earth element.

5. The spin current magnetization rotation magnetoresistance effect element according to claim 3,
   wherein the first ferromagnetic layer contains a CoPt alloy, a FePt alloy, a CoPd alloy, a FePd alloy, a CoCrPt alloy, a HoFe alloy or a SmFe alloy.

6. The spin current magnetization rotation magnetoresistance effect element according to claim 4,
   wherein the first ferromagnetic layer contains a CoPt alloy, a FePt alloy, a CoPd alloy, a FePd alloy, a CoCrPt alloy, a HoFe alloy or a SmFe alloy.

7. The spin current magnetization rotation magnetoresistance effect element according to claim 1, wherein a thickness of the first ferromagnetic layer is thinner than a thickness of the second ferromagnetic layer.

8. The spin current magnetization rotation magnetoresistance effect element according to claim 1,
wherein the nonmagnetic layer has a spinel crystal structure.

9. A magnetic memory comprising a plurality of spin current magnetization rotation magnetoresistance effect elements according to claim 1.

10. A magnetic memory, comprising:
a plurality of spin current magnetization rotation magnetoresistance effect elements according to claim 1,
wherein an easy magnetization axial direction of the first ferromagnetic layer and a second ferromagnetic layer constituting a first spin current magnetization rotation magnetoresistance effect element is a first direction, and
wherein a direction, in which the first spin current magnetization rotation magnetoresistance effect element and a second spin current magnetization rotation magnetoresistance effect element closest thereto are connected, is different from the first direction.

11. The spin current magnetization rotation magnetoresistance effect element according to claim 1,
wherein the first ferromagnetic layer contains a rare earth element, and
wherein the second ferromagnetic layer contains Fe.

12. The spin current magnetization rotation magnetoresistance effect element according to claim 1,
wherein the first ferromagnetic layer contains a rare earth element,
wherein the second ferromagnetic layer does not contain a rare earth element, and
wherein the thickness of the first ferromagnetic layer is thinner than the thickness of the second ferromagnetic layer.

13. The magnetic memory according to claim 9,
wherein an easy magnetization axial direction of the first ferromagnetic layer and a second ferromagnetic layer constituting a first spin current magnetization rotation magnetoresistance effect element is a first direction, and
wherein a direction, in which the first spin current magnetization rotation magnetoresistance effect element and a second spin current magnetization rotation magnetoresistance effect element closest thereto are connected, is inclined 45° degree from the easy magnetization axial direction of the first ferromagnetic layer and the second ferromagnetic layer.

* * * * *